United States Patent [19]
Rattlingourd et al.

[11] Patent Number: 4,536,878
[45] Date of Patent: Aug. 20, 1985

[54] BIT SERIAL CONVOLUTIONAL DECODER FOR VLSI IMPLEMENTATION

[75] Inventors: Glen D. Rattlingourd; Robert J. Currie, both of Salt Lake City; Stanley D. Moss, Kaysville, all of Utah

[73] Assignee: Sperry Corporation, New York, N.Y.

[21] Appl. No.: 429,315

[22] Filed: Sep. 20, 1982

[51] Int. Cl.$^3$ ............................................. G06F 11/10
[52] U.S. Cl. ........................................ 371/43; 371/37
[58] Field of Search ..................................... 371/43, 37

[56]  References Cited
U.S. PATENT DOCUMENTS

| | | | |
|---|---|---|---|
| 4,015,238 | 3/1977 | Davis | 371/43 |
| 4,087,787 | 5/1978 | Acampora | 371/43 |
| 4,130,818 | 12/1978 | Snyder | 371/43 |
| 4,208,739 | 6/1980 | Lu et al. | 371/43 X |
| 4,240,156 | 12/1980 | Doland | 371/43 |
| 4,293,951 | 10/1981 | Rhodes | 371/43 |
| 4,404,674 | 9/1983 | Rhodes | 371/43 |

OTHER PUBLICATIONS

Clark et al., "Error-Correction Coding for Digital Communications," Plenum Press, New York, June 1981.

Primary Examiner—Jerry Smith
Assistant Examiner—Michael R. Fleming
Attorney, Agent, or Firm—Kenneth T. Grace; Marshall M. Truex; William C. Fuess

[57]  ABSTRACT

A decoder for forward-error-correcting (FEC) convolutional codes. The decoder uses the Viterbi algorithm for decoding the rate 1/2, constraint length 7 code with generator polynomials $x^6+x^5+x^3+x^2+1$, and $x^6+x^3+x^2+x+1$. The architecture of the instant decoder is appropriate for implementation on a single, monolithic VLSI integrated circuit chip and includes a branch metric calculator circuit which produces output signals representative of input symbol signals. These output signals are supplied to a metric update circuit which evaluates the signals from the calculator circuit and provides decisions to a path update circuit which converges the signals thereto and the output signals of which are evaluated by a majority vote circuit which produces data output signals representative of data input signals.

14 Claims, 9 Drawing Figures

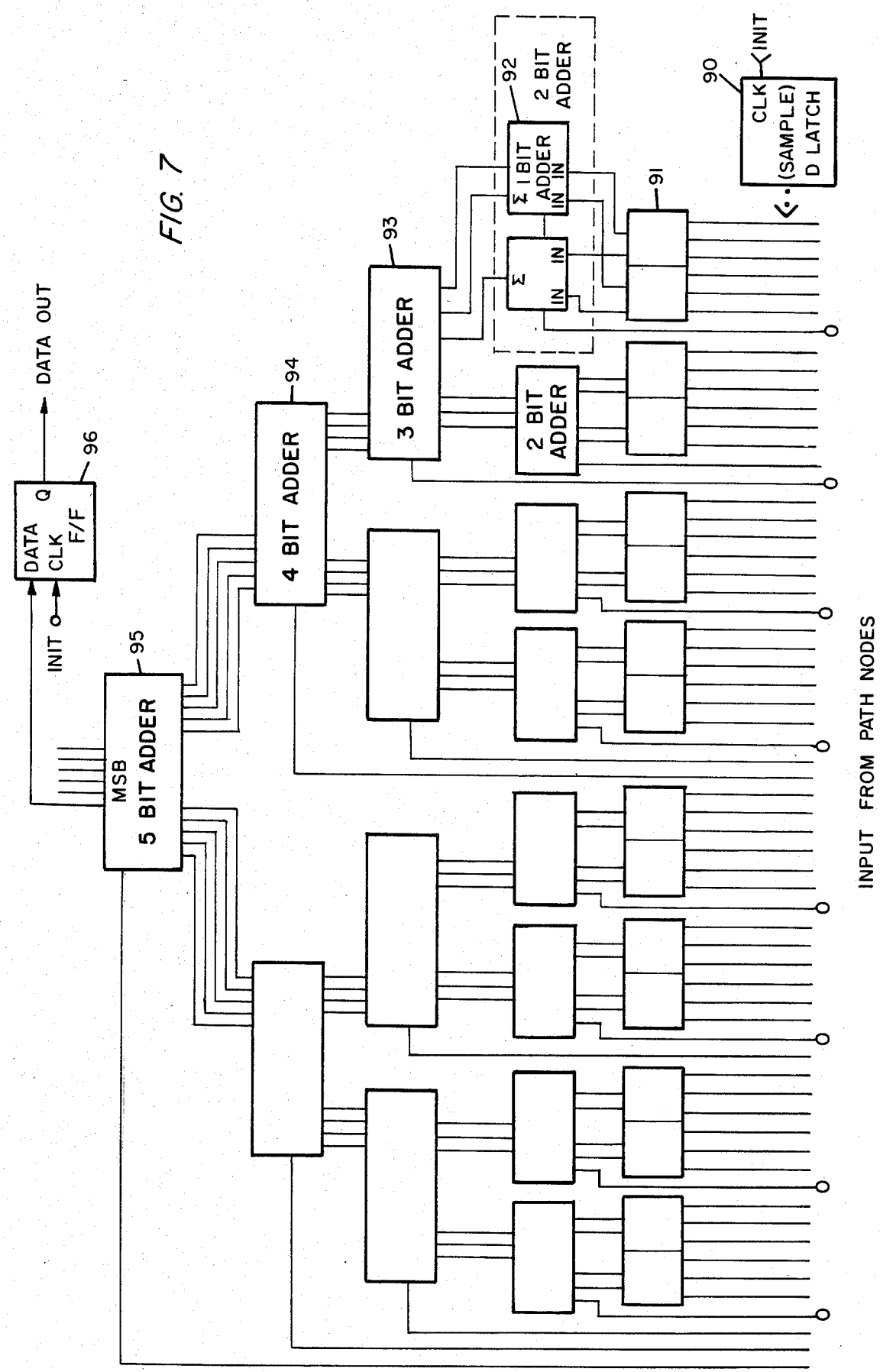

BIT SERIAL CONVOLUTIONAL DECODER FOR VLSI IMPLEMENTATION

BACKGROUND

1. Field of the Invention

This invention is directed to decoder circuits for convolutional codes, in general, and to a circuit which uses the Viterbi-type techniques, in particular.

2. Prior Art

Since the early 1950's many methods of coding have been proposed for error control in digital communication systems. One of the most widely accepted and implemented systems consists of convolutional codes decoded by circuits employing the Viterbi algorithm. This combination, using soft decisions, approaches the optimal decoding strategy (maximum likelihood sequence decoding) for channels where the interference is additive-white-Gaussian-noise (AWGN). The AWGN channel is a good model for both benign and hostile environments where errors effect each bit independently. For channels where errors affect several contiguous bits, as in fading or partial time or partial band jamming, the above coding/decoding system can still be employed with considerable success (approaching optimum performance) by "randomizing" the effect of the channel errors by a process known as interleaving.

In the past, Viterbi-type decoders of constraint length 7 or more have required substantial quantities of circuitry, components, power utilization, etc. Decoders of constraint 3 and 5 have been implemented in VLSI but these devices do not provide sufficient coding gain (communication system performance improvement) for most applications. In some instances this is of little or no consequence, as for example in a stationary ground-to-ground technique. However, in an airborne or space capsule environment, the size, weight and power consumption all become critical. Consequently, it is highly desirable to have a decoding system with minimum size, weight and power requirements. The instant invention is a new and unique apparatus for reducing the operating parameters of weight, size and power consumption while increasing, at least in a relative sense, the operating characteristics of the decoder.

SUMMARY OF THE INSTANT INVENTION

This invention is directed primarily to a decoder which is designed for use with a convolutional encoder. The decoder is of the Viterbi decoder-type having a constraint length of 7. The invention includes a branch metric calculation network, a metric update circuit, a path update circuit, a majority vote circuit and the appropriate control and clock circuits associated therewith. This decoder is capable of operating with a convolutional encoder of constraint length 7. However, the decoder is arranged with unique circuitry configuration so as to be adaptable for VLSI architecture.

BRIEF DESCRIPTION OF THE DRAWINGS

FIG. 7 is a block diagram of a majority vote logic circuit for use with the instant invention.

DESCRIPTION OF A PREFERRED EMBODIMENT

Figure 1:
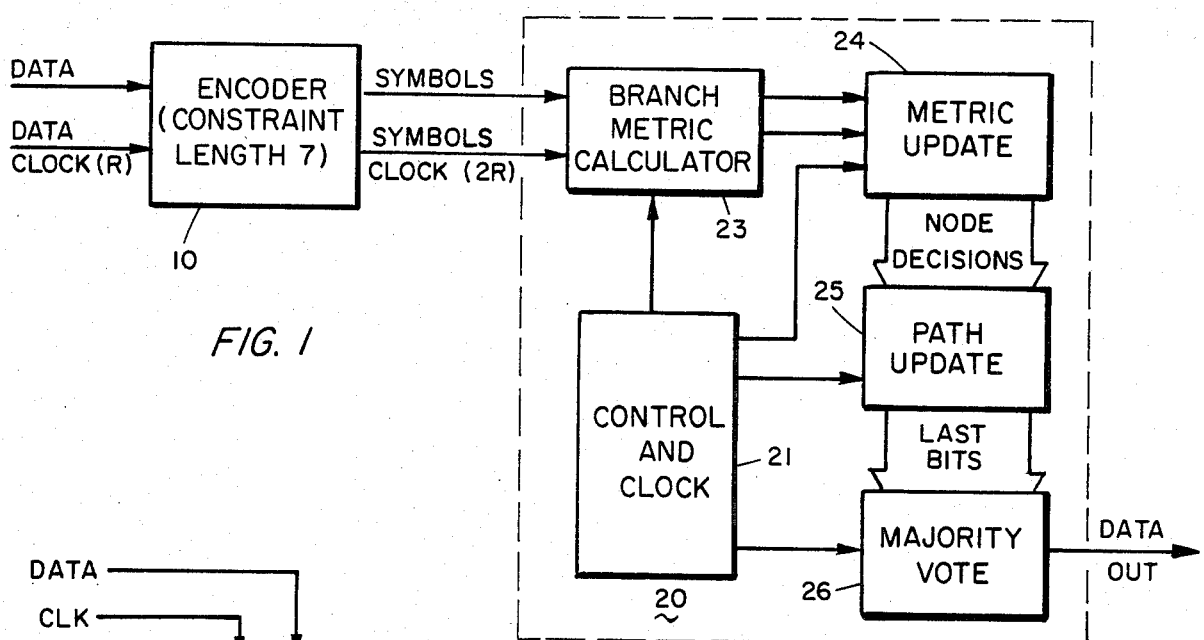
FIG. 1 is a block diagram of the encoder/decoder transmission system.

Referring now to FIG. 1, there is shown a block diagram of a typical information transmission system. More particularly, there is shown an information transmission system which utilizes an encoder 10 of the convolutional type. In the embodiment shown, the encoder 10 has a constraint length 7. This terminology is known in the art and is directed to an encoder which includes seven stages of signal activity as will be described more fully hereinafter. It is to be understood, however, that encoders of this type are well known in the art although the constraint length thereof is generally much less than seven.

The encoder 10 can receive data in the form of binary coded signals. Typically, the data can be of the return-to-zero or the non-return-to-zero (NRZ) type. In addition, a data clock of a frequency rate R is supplied to encoder 10. The data clock is especially useful in the case of the NRZ input data configuration The encoder 10 produces output symbols which are representative of the data bits which are supplied to the encoder. It must be noted that the symbols are not identical to the data bits but are representative thereof. In point of fact, there are generally produced two symbols for each data bit in. In addition, the symbol clock is produced by encoder 10. The symbol clock has a frequency rate 2R, i.e., twice the rate of the data clock.

The decoder 20 is designed to receive the signals from encoder 10. These symbol signals may be in the form of signals transmitted through the air, through hardwire or the like.

In particular, the signals from encoder 10 are supplied to the branch metric calculator 23 which has the effect of, essentially, producing an output signal representative of the symbols which are supplied thereto.

The outputs of the branch metric calculator 23 are connected to the metric update circuit 24 which has the effect of evaluating the output of the branch metric calculator 23 on an ongoing basis and periodically updating the information at the calculator for establishing the parameters of the output data from the decoder.

The outputs of the metric update (identified as node decisions) are supplied to the path update circuit 25. The path update circuit is operative to allow convergence of the data to the most probable path through the encoder tree shown in FIG. 3. Path selection storage of at least 48 bits is provided.

The outputs of the path update circuit 25 are supplied to the majority vote circuit 26. The majority vote circuit receives inputs from all of the nodes in the path and, effectively, determines the value of the output signal produced thereby. The output signal will be either a binary 0 or a binary 1 in accordance with the signals supplied to majority vote circuit 26.

The control and clock circuitry 21 is connected to supply signals to calculator 23, metric update 24, path update 25, and majority vote 26. This operation causes the various operational circuits to be, effectively, synchronized, as well as initialized, normalized, and so forth.

The system shown in block diagram in FIG. 1 is, generally, a known system configuration. However, the implementation of the system is unique as is the architecture thereof. As will be apparent, the architecture permits the system to be implemented in VLSI techniques. A preferred embodiment uses CMOS techniques to achieve high speed and low power tradeoffs, as is known in the art. However, the invention is not limited to CMOS or the like.

Figure 2:
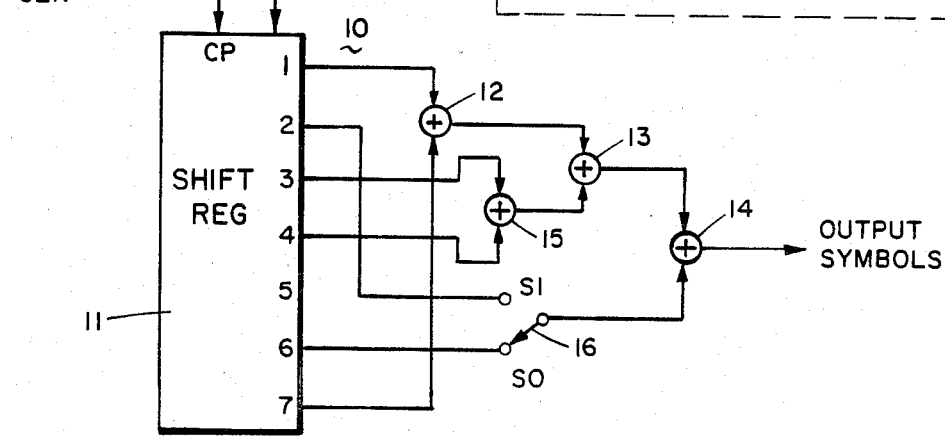
FIG. 2 is a schematic diagram of an encoder known in the art.

Referring now to FIG. 2, there is shown a schematic block diagram of a convolutional encoder of typical configuration. In the encoder 10, a shift register 11 having seven stages is provided. Thus, the encoder is referred to as a constraint length 7 encoder. The data is supplied to the shift register in NRZ serial form. When the information is supplied thereto, the clock signal selectively enables the shift register to receive and shift the data input bits. As is typical, the data propagates through the shift register stages, in series, and is ultimately shifted out of the last stage and lost.

However, in this particular embodiment, stages 1 and 7 are combined by means of an exclusive-OR gate 12. In similar fashion, stages 3 and 4 are combined by an exclusive-OR gate 13. The output of gate 13 is supplied to one input of exclusive-gate 14.

Stages 2 and 6 are separately connected to terminals S1 and S0, respectively, of switch 16. The common terminal of switch 16 is connected to the other input of exclusive-OR gate 14. The output of gate 14 produces the output symbols which are representative of the data bits supplied to shift register 11. In other words, when switch 16 is in the S0 position, symbol 0 is produced. It is equal to the odd parity of bits 1, 7, 3, 4 and 6. When switch 16 is in the S1 position, symbol 1 is produced that is the odd parity of bits 1, 7, 3, 4 and 2.

In operation, the data bits are supplied to and shifted through shift register 11 as noted. This operation is achieved in accordance with the clock signal of frequency R. At the same time, a clock signal 2R is supplied to switch 16 in order to make the connection alternatively between terminal S0 and terminal S1. Thus, switch 16 is switched at twice the data clock rate. In another interpretation, the terminals S0 and S1 are each connected to gate 14 during a data clock pulse. Also, the output of gate 14 produces two symbol output signals (representative of the connections of switch 16 to terminals S0 or S1) during a data clock pulse period. The operation of the encoder 10 is known in the art. However, briefly stated, the bit information at stages 1 and 7 are exclusive-OR'd to produce a signal representative of the bits in stages 1 and 7. Likewise, the bits in stages 3 and 4 are exclusive-OR'd to produce another signal representative of these bit conditions. The output signals of gates 12 and 15 are exclusive-OR'd by gate 13 to produce yet another signal representative of the outputs from gates 12 and 15. The bits at stages 2 and 6 are selectively supplied to exclusive-OR gate 14 to be exclusive-OR'd with the output of gate 13. Gate 14, thus, produces output symbols which are representative of the total signal "picture" stored in shift register 11 at that instant.

As the information propagates through shift register 11, the output symbols may (or may not) change depending upon the pattern which is propagating through the shift register. This operation is well known in the art. Nevertheless, it must be clear that the output symbols produced by encoder 10 are merely representative of the signal pattern in the shift register and are not copies of the signals, per se.

Figure 3:
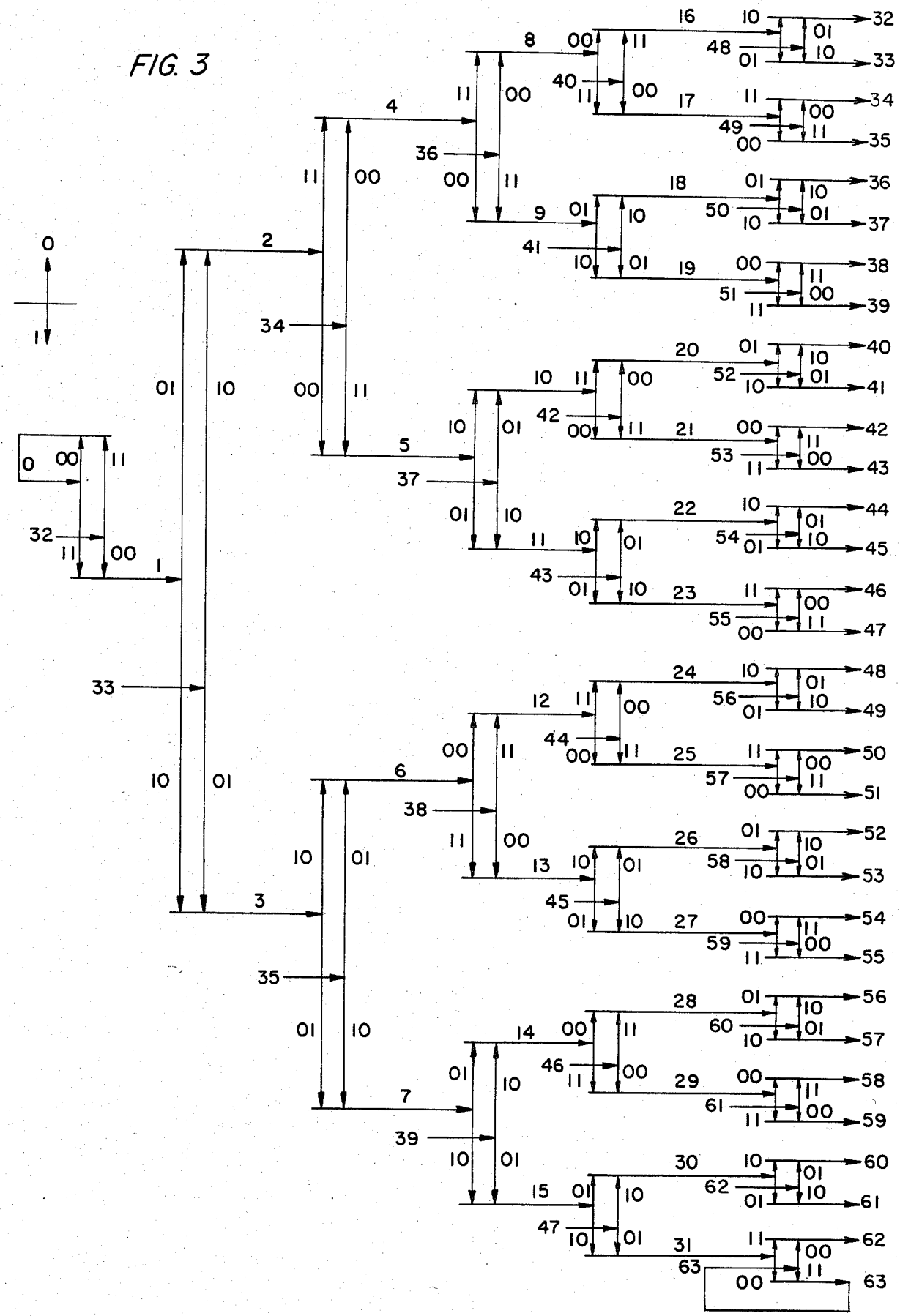
FIG. 3 is a schematic representation of an encoder tree of the Viterbi-type for a constraint 7 encoder.

Referring now to FIG. 3, there is shown a tree-code representation for the encoder of FIG. 2. This encoder is related to the constraint length 7 encoder. The tree includes thirty-two double-nodes and is a variation of the known code reprsentations for so-called Viterbi encoders. A discussion of this type of tree code (and the underlying codes) is described in an article entitled "Convolutional Codes and Their Performance in Communication Systems", by A. J. Viterbi, published in the IEEE Transactions on Communications Technology, Volume COM-19, No. 5, October 1971, pages 751 through 772. The tree code representation is depicted on page 753. This tree code is, however, related to a constraint 3 decoder used as an example in the subject article. (A similar constraint 3 code tree and convolutional encoder is shown in article titled "Alternatives in Digital Communications"by M. P. Ristenblatt, published in the proceedings of the IEEE, June 1973, pages 703 through b 721, particularly at pages 715 and 716.) These publications are incorporated herein by reference.

Figure 4:
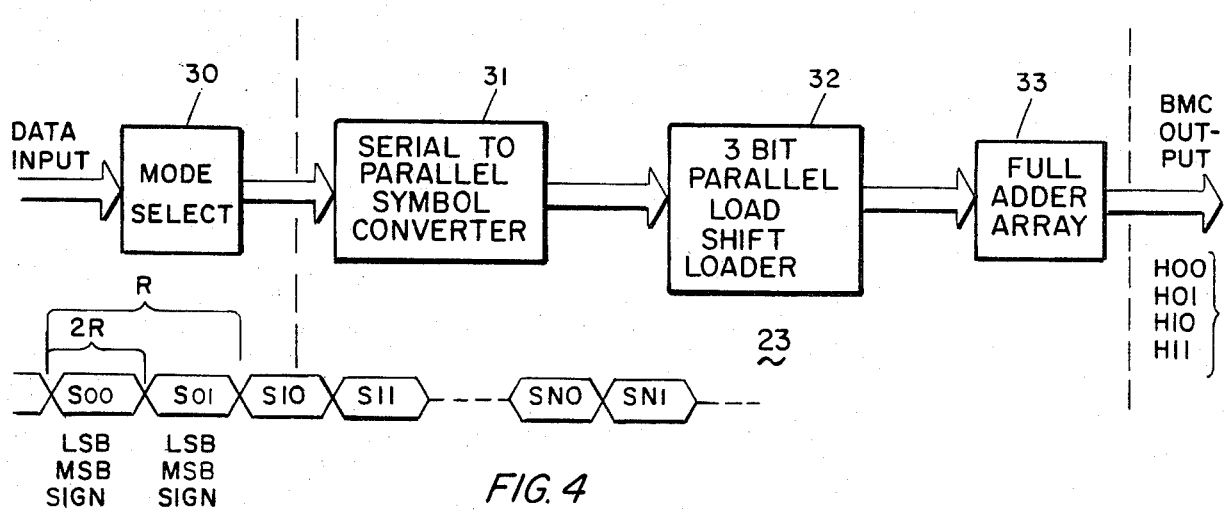
FIG. 4 is a block diagram of a branch metric calculator circuit used in the instant invention

Referring now to FIG. 4, there is shown a block diagram of a branch metric calculator which is used in the decoder of the instant invention. In this particular design, the data input is received from the appropriate source such as a hard-wire, an FM Receiver or the like. This data input is in the form of symbols produced by the encoder 10 and which represent the data signals supplied to the encoder. The data input symbols are supplied to the mode select 30 which operates to convert the input symbols from a sign magnitude to binary format. The mode select 30 is connected to supply signals to the serial-to-parallel symbol converter 31. Converter 31 operates, basically, to store the serially supplied signals from mode select 30 to permit a parallel output situation. Typically, the first symbol 500 so supplied by mode select 30 comprises three bits (sign, MSB and LSB). These bits are supplied to a first buffer register in the converter 31. When the second symbol (which also comprises three bits) is clocked from the mode select 30, the three bits are supplied to a second buffer register. Likewise, the bits previously stored in the first buffer register are supplied to a different portion of the second buffer register. The total complement of bits (in this embodiment 6 bits are present) is then stored in the second buffer register. In other words, the first three bits are stored and held in a temporary register until they are combined with the second set of bits in a second register.

The total complement of bits is then supplied from converter 31 to the parallel load shift register array 32. This array can comprise a plurality of register circuits, each of which receives three bits. The registers receive various combinations of bits from the second register in converter 31 and operate thereon. The shift register array 32 then supplies output signals to the full adder array 33 which comprises a plurality of full adders connected together in an array to produce the appropriate branch metric calculator output signals (BMC). These signals represent the difference between the received symbol pairs and the four possible symbol pair combinations (00,11,01 and 10). These signals are referred to as $H_{00}$, $H_{11}$, $H_{10}$, and $H_{01}$. These output signals are measures of the metric in the respective branches of the branch metric calculator circuit.

Figure 5:
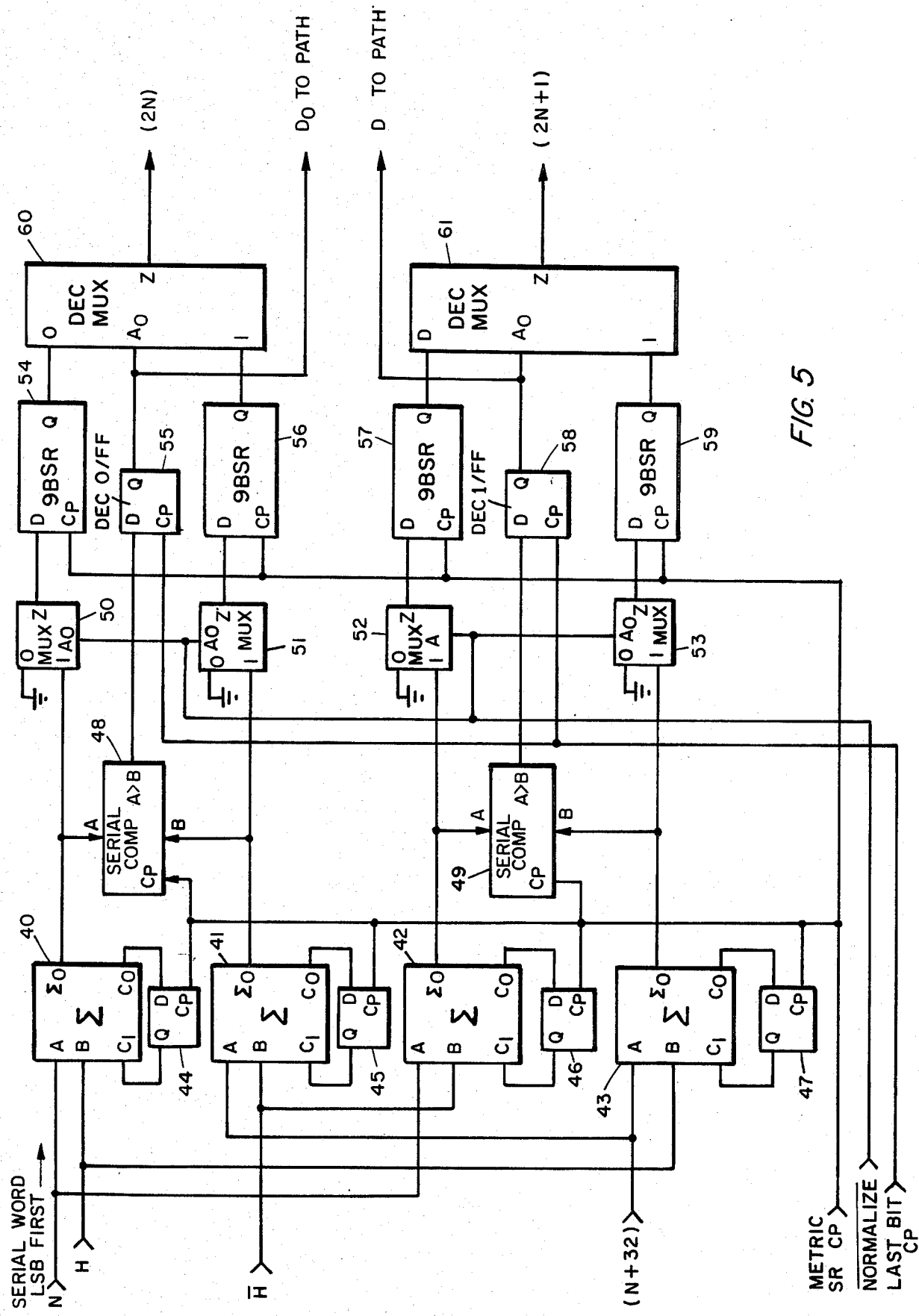
FIG. 5 is a block diagram of the metric update or calculator circuit of the instant invention.

These signals are then supplied to the metric update circuit 24 (see FIG. 5). In the embodiment shown, these signals are four in number as defined above. The metric update circuit then calculates the error and accumulates these errors which are measured at each of the 64 nodes of the encoder tree shown in FIG. 3. That is the circuit produces a calculation which is effectively the minimum error for the metric value of the measurement. The circuitry shown in FIG. 5 is directed to the circuitry arrangement regarding one "double-node" in the metric calculator. A typical double-node shown in FIG. 3 is the 0, 1 node which has inputs from the 0 and 32 nodes. In this embodiment, i.e., a constraint length 7 configuration, there are 32 double-nodes in the circuitry.

Again, in the particular embodiment shown in FIG. 5 the circuit configuration is designed to specifically adapt to a constraint length 7 application which is adapted to be implemented in a VLSI chip configuration. Thus, the specific circuitry embodiment permits a reduced number of gates and other components in the circuitry. The embodiment uses the serial operation, such as shift registers and the like to enhance this implementation.

One set of inputs to the double-node metric calculator circuit is the stored metric value from the last update. These inputs come from nodes N and N+32 (where N varies from 0 to 31). The other input terminals H and $\overline{H}$ are supplied from the branch metric calculator 23. The value of H and $\overline{H}$ varies with the node under investigation. For nodes 0 and 1, H is equal to $H_{00}$ and E,ovs/H/ is equal to $H_{11}$ from the branch metric calculator. But, for nodes 4 and 5, H is equal to $H_{11}$, and $\overline{H}$ is equal to $H_{00}$ (see FIG. 3). In particular, the N input signal is supplied to one input of full adder 40 and one input of full adder 42. In similar fashion, the input signal N+32 is supplied to one input of full adder 43 and to one input of full adder 41. The metric measurement signal $\overline{H}$ is supplied to one input of each of full adders 41 and 42. Each of the full adders 40 through 43 has the carry-out output terminal CO connected to the carry-in terminal CI thereof via the respective carry flip-flop 44, 45, 46 or 47. In each case the carry-out terminal is connected to the D input terminal of the flip-flop and the Q output terminal of the flip-flop is connected to the carry-in terminal. The clock pulse terminals CP of each of the carry flip-flops is connected to receive the metric clock pulse of frequency 2R.

The summing output terminals of full adders 40 and 41 are connected to the A and B input terminals of comparator 48 as well as to the "1" input terminals of multiplexers 50 and 51, respectively. The other terminals of these normalization multiplexers are connected to ground or other suitable reference point. The control terminal 40 of the normalization multiplexers is connected to receive the $\overline{\text{NORMALIZE}}$ signal. The outputs of multiplexers 50 and 51 are connected to nine-bit shift registers 54 and 56, respectively. These shift registers (9BSR) are referred to as the metric shift registers. The outputs of registers 54 and 56 are connected to the 0 and 1 inputs of the decision multiplexer 60, respectively. The output of multiplexer 60 is the 2N output of the metric path.

The output of serial comparator 48 is connected to the D input of decision flip-flop 55 which has the Q output terminal thereof connected to the control terminal A0 of multiplexer 60. In addition, the Q terminal of decision flip-flop 55 is connected to the D0 output terminal which goes to the path circuitry of FIG. 6. The clock pulse supplied to comparator 48 is the same as the clock pulse supplied to the carry flip-flops 44 through 47. The clock pulse supplied to decision flip-flop 55 is supplied by the LAST BIT CP which is controlled by a bit counter in the control logic circuitry 21 shown in FIG. 1.

In a similar manner, a second channel between the N+32 input terminal and the 2N+1 output terminal is provided. This channel includes serial comparator 49, similar to comparator 48, as well as normalization multiplexers 52 and 53, shift registers 57 and 59, decision flip-flop 58 and decision multiplexer 61. The connections in the second channel are substantially the same as the connections in the first channel so that the two channels operate substantially similar.

In operation, the input signals N, N+32, H, and $\overline{H}$ are provided to the respective full adders as shown and described. The signals are added together by the respective full adders and the sum signals are supplied to the respective comparators 48 and 49. Inasmuch as the input information is supplied in a serial word with the least significant bit (LSB) first, the addition (summing) and comparison is produced on a bit-by-bit basis. Thus, the bits provided by the full adders 40 and 41 are serially compared by comparator 48. In this comparator, if the input A from adder 40 is greater than the input B from adder 41, a binary bit 1 is produced by the comparator. Conversely, if B is greater than A, a binary zero is provided. This signal is supplied to the D terminal of the decision flip-flop as noted above. In addition, the signals from the adders are supplied to the appropriate normalization multiplexers. These signals are transmitted through the multiplexers and stored, serially, in the respective nine bit metric shift registers 54 and 56. These signals are then provided to multiplexer 60. However, which of these signals is to be utilized is determined by decision flip-flop 55. Decision flip-flop 55 is activated during the shifting of the last, i.e., MSB, bit into the full adders. Consequently, when the full adder has received the last bits from the branch metric calculator, the full adders operate to produce the appropriate output signals which are then applied to the comparator 48. Depending upon which of these words is determined to be larger, the decision flip-flop then determines which of the signals stored in registers 54 and 56 is larger. The flip-flop then controls MUX 60 to produce a path therethrough for the smaller of the signals N or N+32 which is then supplied to terminal 2N in the metric path (see FIG. 3) for use in the next calculation.

In a similar fashion, adders 42 and 43 also operate on the signals N and N+32 but with the complementary signals from the branch metric calculator. Again, however, serial comparator 49 compares the input signals on a bit-by-bit basis and effectively causes decision flip-flop 58 to select which of the signals stored in shift registers 57 and 59 is smaller and to activate MUX 61 to permit the smaller signal to be transmitted therethrough to node 2N+1. Thus, the updated metric calculation always permits the smaller signal to be selected and, as a consequence, the shorter metric path is selected. This operation is in compliance with the operation of the Viterbi coding technique.

The normalization MUX 50, 51, 52 and 53 are utilized in order to keep the accumulator from overflowing. That is, the contents of the respective shift registers are prevented from rolling over from a full condition, for example all 1's, to the next condition which would be, for example, all 0's with the application of a single further bit count. In this case, the normalization circuitry determines when the MSB of all the nodes is a binary 1 (or not as the case may be). When the MSB of all the measurements is a 1, the normalization MUX forces the most significant bit to a zero thereby to prevent a rollover condition. That is, the most significant bit is replaced by a binary zero. In other words, the normalization circuit has detected the all 1's condition and has selectively activated the MUX 50 and MUX 51 to replace the most significant bit with a binary 0. This bit is supplied to the shift register without having passed through the serial comparator.

Figure 6:
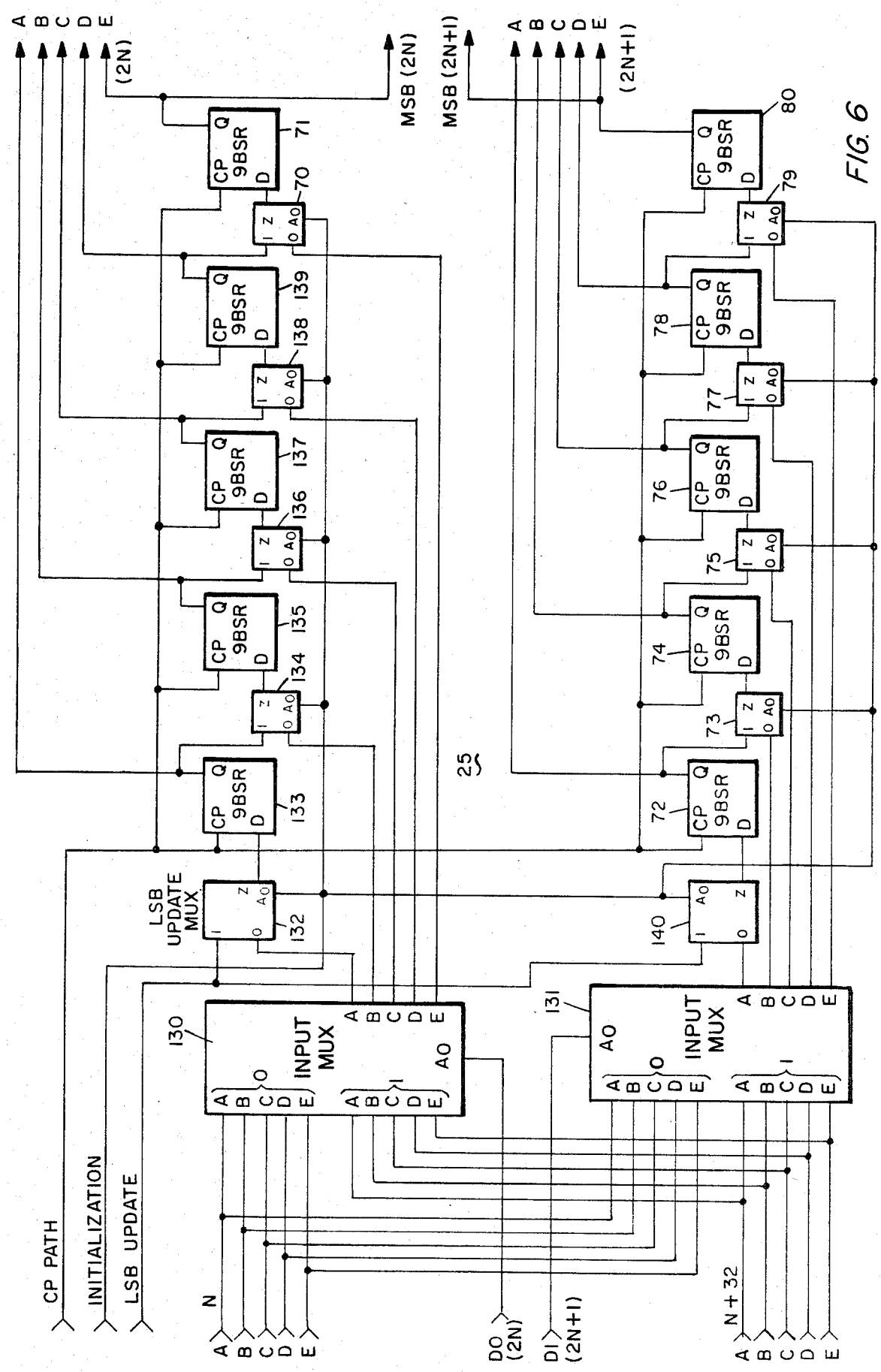
FIG. 6 is a block diagram of the path update circuit of the instant invention.

Referring now to FIG. 6 there is shown a schematic block diagram of the path circuit 25. This circuit provides the path module for calculating the path of the convolutional decoder of the instant invention. In this circuit, there are two input multiplexers namely, MUX 130 and MUX 131. Each MUX has input terminals connected to node N of the metric circuit. In addition, each MUX has the input terminals thereof connected to node N+32 of the metric circuit. In particular, the 0 terminals of each MUX are connected to the N input terminal while the 1 input terminals of each MUX are connected to the N+32 terminal. The decision terminals D0 and D1 from the 2N and the 2N+1 channels of the metric calculation decoder circuit of FIG. 5 are connected to the control terminals A₀ of the multiplexers 130 and 131, respectively. Thus, depending upon the value of the control signals D0 and D1, the value of N or N+32 is transmitted through the respective multiplexer. It should be remembered from the circuit as FIG. 5, that the D0 signal indicates that the decision is from the 2N side of the metric calculator while the D1 signal represents that the decision is from the 2N+1 side of the metric calculator.

The output of the respective input multiplexers is connected to a plurality of 9-bit shift registers. These shift registers are selectively connected to provide separate 9-bit shift registers or a single 45-bit register. The interconnection is controlled by interstage multiplexers which are controlled by the initialization signal INIT which is supplied to the control terminal A₀ thereof.

In particular, a first multiplexer, referred to as the LSB update MUX 132 (or 140) is connected to receive the LSB update signal at the 1 terminal thereof. Also, one bit of the output produced by the respective input MUX 130 and 131 is received at the 0 input terminal of MUX 132 (or 140). Depending upon the state of the the initialization signal which is supplied to the control terminal the 1 or 0 signal is transmitted through the MUX and supplied to the D input terminal of shift register 133 which has the clock pulse terminal thereof connected to receive the path circuit clock pulse (PATH CP). The Q output terminal of shift register 133 is connected to the 2N output bus terminal as well as to the 1 input terminal of MUX 134. The 0 terminal of MUX 134 is connected to one terminal of the output of MUX 130. The control terminal of MUX 134 is connected to receive the initialization signal. The output of MUX 134 is connected to the D input terminal of shift register 135 which has the clock pulse terminal thereof connected to the path clock pulse signal. The Q output terminal of register 135 is connected to the output terminal B of the 2N node bus and to the 1 input of MUX 136. MUX 136 has the 0 input thereof connected to the C output terminal of MUX 130 and the control terminal thereof connected to receive the initialization signal. Similar connections are made for shift registers 139 and 71 and for the multiplexers 138 and 70. However, the Q output terminal of shift register 71 is connected both to the 2N terminal bus and to the most significant bit (MSB) output terminal for the 2N terminal.

A similar channel circuit configuration is associated with MUX 131. Thus, the least significant bit update MUX 140 is connected to receive signals from the LSB update and the A output terminal of MUX 131. The trigger pulse is also supplied by the initialization circuit. Likewise, 9-bit shift registers 72, 74, 76, 78 and 80 are connected to receive the path clock pulse and to supply the Q output signals on the 2N+1 output terminals. The intermediate multiplexers 73, 75, 77 and 79 are connected between the shift registers as shown and are adapted to receive the initialization signal as the trigger signal therefor.

In the configuration shown in FIG. 6, the MSB output signals produced by registers 71 and 80 represent the actual data or information which is supplied by the particular node in question In operation, the data from the nodes N and N+32 are supplied to the input multiplexers 130 and 131, respectively. As noted above, the input which is selected for operation by the MUX is determined by the decision signal D0 or D1 from the metric circuit. This information is used in updating and providing a new value to be supplied back to the node for the metric path. The new information which is added to the existing information and which is stored in the input MUX is supplied via the LSB update signal and the LSB update MUX 132. Thus, the initialization pulse is supplied during the initial bit time, for example 0, during which time the LSB update is supplied to the MUX 132. (Of course, similar comments relate to the operation of the LSB MUX 140.) At the same time, the initialization pulse is supplied to the intermediate MUX circuits 134, 135, 138 and 70. This permits the signal at the Q output terminal of shift registers 133, 135, 135 and 139 to be routed through the respective MUX for application to the next succeeding shift register. Thus, the path length for the shift register appears to be approximately 50 bits. By connecting the LSB update input of nodes 0 through 31 to a logic zero level and nodes 32 through 63 to a logic one, an apparent path length extension of five bits is provided. Thus, the memory has been extended by five bits to provide a new and unique storage apparatus.

Subsequent to the application of the initialization pulse which permits the LSB update signal to be routed through MUX 132 and the Q output signals from the respective shift registers to be supplied to and routed through the multiplexers, the clock pulse signal is supplied wherein the respective signals supplied to the D input terminals are now clocked into the respective shift registers. It will be noted, in this instance, that the various multiplexers are not activated wherein the signals from the shift registers are applied to the output terminals 2N and, effectively, lost to the shift registers, per se.

Thereafter, with the initialization signal at the low level, the 0 side of the respective multiplexers 132, 134, 136, etc., are activated. In addition the output terminals A, B, C, D and E of the input MUX 130 are connected to the 0 input terminals of the multiplexers. With the application of the path clock pulse, each of the shift registers 133, 135, 137, 139 and 71 is activated so that the signals applied to the appropriate multiplexers are then clocked into that shift register. The signals at the Q output terminals are supplied to the specific terminals A, B, C, D and E of the 2N terminal as well as to the 1 terminal of the suceeding multiplexers. If the 1 sides of the multiplexers are not activated, these signals are of no consequence at this time.

Thus, the circuit produces signals which are representative of the symbols detected and operated upon by the metric calculation circuit. The specific circuits shown and suggested in FIG. 6 are capable of operating at relatively high speeds. Consequently, this operation can be performed and concluded between the applications of signals from the metric calculator circuit which is also capable of operating at high speed between the application of various symbols from the branch metric circuit.

Referring now to FIG. 7, there is shown a schematic block diagram of one embodiment of a majority vote circuit using a plurality of adder type circuits. The majority vote circuit of FIG. 7 is connected to receive, as the inputs thereof, the most significant bit (MSB) from the respective nodes as shown in the path circuit of FIG. 6. These signals are supplied to the inputs of various latches 90 which are of suitable configuration. These latches are activated by the initialization signal (INIT). In essence, the majority vote circuit calculates the most significant bits from the nodes, as noted, and produces a signal which is representative of the majority of the node signals. That is, if the majority of these signals are binary 1's, a binary 1 is produced by the circuit of FIG. 7. Conversely, if a majority of the most significant bits of the nodes are zeroes, the data output signal will also be zero. The mechanism for calculating these signals is shown in FIG. 7.

The output signals from each of the nodes carries the same weight or value and is supplied to the adder circuit shown in FIG. 7. In the first level adder network, a plurality of 3-bit adders 91 are arranged to receive three output signals from the path circuit. The input signals from the path circuit have the weight $2^0$. In operation, each of the adder circuits 91 produces a sum signal equal to $2^0$ with a carry signal having a weight of $2^1$. The $2^0$ signals are combined in one of the two bit adders in adder row 92 while the $2^1$ signals are added in another 1- bit adder. This operation continues with inputs supplied to the 3-bit adders in adder circuits 93. Again, the 3-bit adder produces output signals which are supplied to the 4-bit adders in adder row 94 which are then connected to the 5-bit adder 95. The 5-bit adder produces, inter alia, the MSB output signal which is supplied to the data input of flip-flop 96 for selected storage therein, in response to the initialization signal. Thereafter, the input at the data terminal of flip-flop is transferred to the Q terminal 96 and produces the data out signal which will be either a binary 1 or binary 0 depending upon the majority value supplied to the input of majority vote circuit in FIG. 7.

Figure 8:
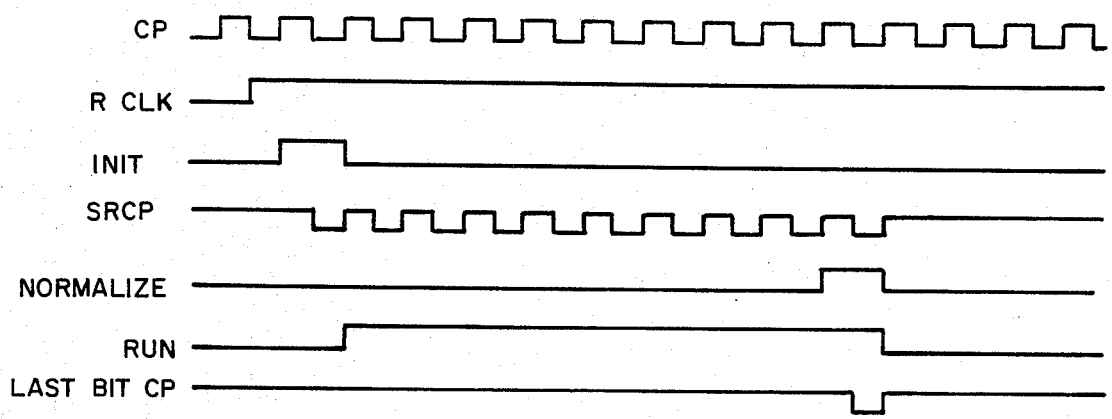
FIG. 8 is a timing diagram for the circuits of the instant invention.

Referring now to FIG. 8, there is shown a timing diagram for certain pulses which are supplied to and/or by the system. Thus, while reviewing the description of this illustration, reference is made to the other Figures in the application wherein the specific signals are shown and described relative to the specific circuitry. For example, the clock pulse CP is shown. This clock pulse is generated by an oscillator (see FIG. 9) which can be included in the control and clock circuit 21 shown in FIG. 1. This clock signal is, of course, continuous and supplied throughout the entire system. In addition, the control logic 21 (FIG. 1) produces the initialization signal (INIT) which is supplied to the several circuits to produce the initialization operation as described relative thereto. This signal starts the various sequences described with regard to the several circuits shown. In addition, at the same time, the branch metric calculator 23 is loaded in accordance with the signal LOAD BMC. This begins the loading of the branch metric calculator signals into the appropriate shift registers which are included in the shift register array 42 in FIG. 4. The metric shift register clock pulses (MSR CP) are also supplied to the 9-bit shift registers 54, 56, 57 and 59 shown in FIG. 5. This signal operates to propagate the signals through the shift register as described relative to FIG. 5. It is noted that this clock pulse signal has the same shape and frequency as the master clock pulse CP.

At the same time, the least significant bit control signal LSB CONTROL is supplied to the least significant bit update MUX 32 in FIG. 6. Thus, the new least significant bit is added to the path circuit and the most significant bit is rolled off at the output and supplied to the majority vote as described, supra.

With the application of the initialize signal (INIT) to the majority vote circuit in FIG. 7, the appropriate signals are supplied thereto and the appropriate operation is followed. This operation is performed during clock pulse 0.

During time periods 1 through 9, the initialization and loading has essentially taken place. The metric shift register clock MSR CP now continues to pulse the shift registers and to cause information to propagate therethrough. In particular, at time period 9, the metric most significant bit checking signal is provided to determine whether there are all one's in the shift register or not. At the same time, the normalize signal is also provided. This permits the testing of the shift register to determine whether a signal of all 1's is propagated and to normalize this signal, if necessary, as described relative to FIG. 5.

The RUN signal is supplied to the branch metric calculator and permits this circuit to operate as described.

The last-bit-clock-pulse is provided to the decision flip-flops 55 or 58 as noted relative to FIG. 5. This pulse is provided by control and clock circuits within circuit 21 of FIG. 1. This pulse permits the strobing or clocking of the decision flip-flops to determine the operation of decision MUX 60 as previously described. The path signals are primarily the clock pulses which have been previously discussed to cause the information to propagate through the path 9-bit shift registers as described relative to FIG. 6.

The INIT pulse is used to load the previously calculated data into flip-flop 96 and also to load in the new MSB's from all path nodes.

Figure 9:
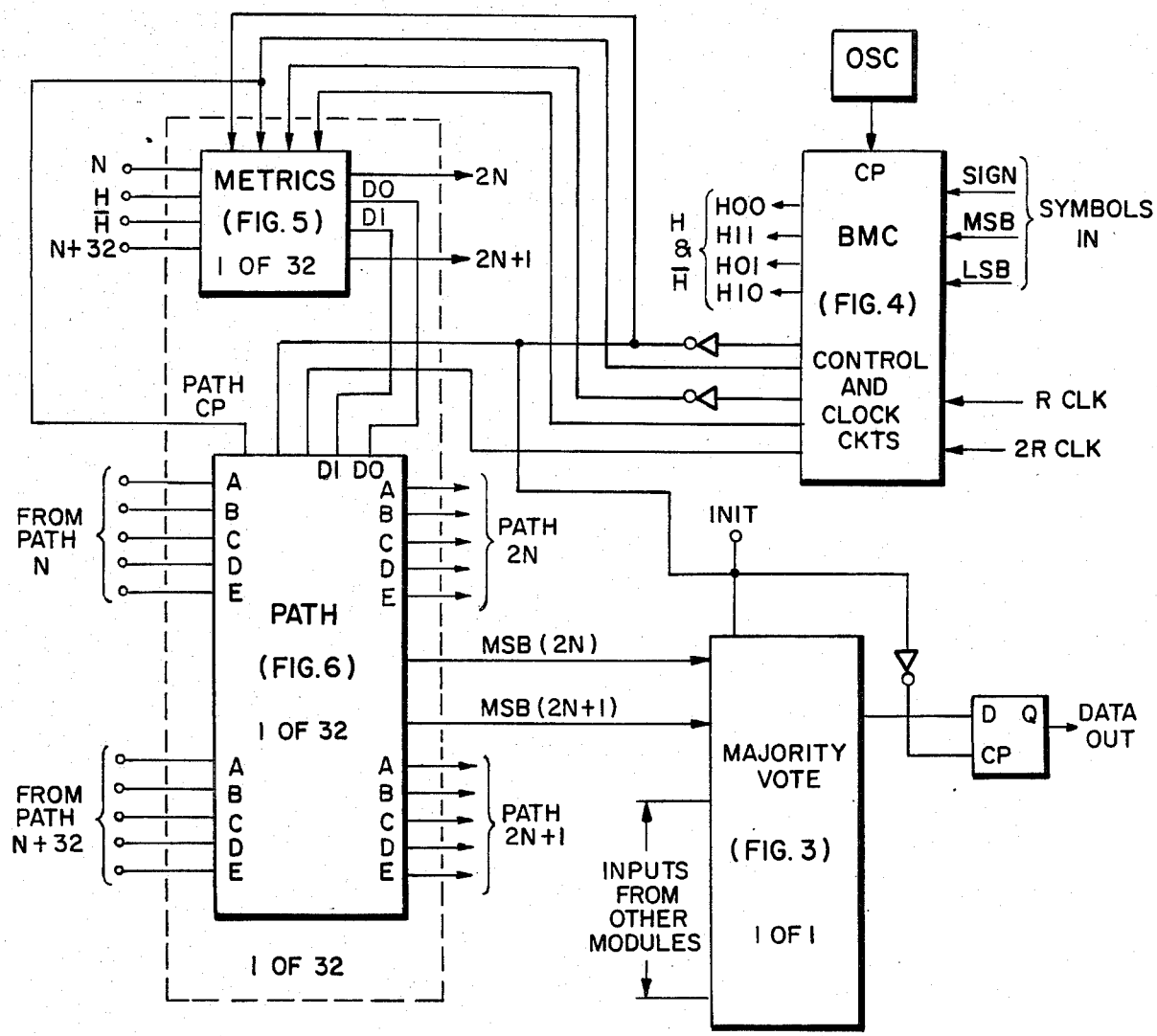
FIG. 9 is a block diagram of the convolutional decoder arrangement of the instant invention showing more specific interconnections therefor.

Referring now to FIG. 9, there is shown a somewhat more detailed version of the basic interconnect arrangements for the convolutional decoder of the instant invention. In particular, the branch metric calculator (BMC) and control functions are included in a single block. Likewise, the metric update circuitry is shown in another block. The path module or update circuit is also shown in a separate block as is the majority vote circuit. As shown in FIG. 9, the majority vote circuit is a separate block and comprises one unit only. However, the combination of the metric update and the path module, as shown in FIG. 9, represent one of 32 double node circuits. The BMC and control block is also a single block.

In particular, the BMC and control block is connected to receive the clock pulses CP from the oscillator. In addition, the BMC and control block receives the input symbols as well as the clock signals R and 2R which are effective to control the clocking of the symbols in the circuit.

The BMC and control block produces the complement of the initialize signal ($\overline{INIT}$) as well as the branch metric calculating signals namely $H_{00}$, $H_{11}$, $H_{01}$ and $H_{10}$. In addition, the control portion of the circuit produces the shift register clock pulse CP, the LAST BIT CLOCK and the NORMALIZE signals. All of these signals are shown in other Figures, especially FIG. 8.

In addition, certain of these signals are connected to other portions of the circuit, as shown. For example, the shift output signal from the BMC and control block is supplied to an input of the majority vote circuit and the output flip-flop associated therewith. Likewise, the initialize signal (INIT) is supplied to the metric update circuit (via an investor). In similar fashion, the last bit clock pulse, the branch metric calculated signals and so forth are also connected to the other blocks. This diagram is believed to assist in understanding the relationship of the various circuit components when organized into the circuit of the instant invention. Thus, there is shown and described a decoder circuit which is used in a forward-error-correcting mode. The circuitry is especially adapted for use with convolutional coding techniques. The circuit is further, especially adapted for implementation in VLSI circuit arrangements. While specific circuit arrangements are discussed, other similar circuits can be contemplated for use as well. However, any such alternative circuit arrangements which fall within the purview of this discussion are intended to be included therein as well. That is, the embodiments shown and described are intended to be illustrative only. The scope of the invention is limited only by the scope of the claims appended

Having thus described a preferred embodiment of the invention, what is claimed is:

1. A decoder circuit comprising,
   calculator means (23) for receiving coded symbol signals and producing calculator output signals representative of said symbol signals,
   said calculator means includes serial-to-parallel converter means for converting said symbol signals to parallel output signals,
   full adder means connected to said serial-to-parallel converter to receive said parallel output signals and produce said calculator output signals which are representative of said symbol signals,
   evaluator means (24) for receiving said calculator output signals from said calculator means and producing evaluator output signals which indicate a minimum value of said calculator output signals and are used in establishing the output signals to be produced by the decoder circuit,
   convergence means (25) for receiving said evaluator output signals from said evaluator means and producing convergence output signals representative of the most probable signal conditions,
   said convergence means includes multiplexer means connected to receive said evaluator output signals and shift register means connected to receive output signals from said multiplexer means,
   said shift register means comprises a plurality of shift registers and a plurality of multiplexer devices,
   one input of each multiplexer device connected to an output of said multiplexer means,
   another input of each multiplexer device connected to an output the preceding shift register,
   the output of each multiplexer device connected to an input of the succeeding shift register, and
   valuation means (26) for receiving said convergence output signals from said convergence means and producing a decoder output signal representative of the coded symbol signals supplied to said calculator means.

2. The decoder circuit recited in claim 1 wherein, said evaluator means operates upon signals stored therein together with calculator output signals from said calculator means to produce said evaluator output signals.

3. The decoder circuit recited in claim 2 wherein, said evaluator means includes evaluator adder means which operates on the signals stored in said evaluator means and signals supplied by said calculator means.

4. The decoder circuit recited in claim 3 including comparator means connected to said evaluator adder means to determine which of the output signals produced by said evaluator adder means is greater.

5. The decoder circuit recited in claim 4 including, decision flip-flop means connected to said comparator means to produce a decision signal based upon the output signal produced by said comparator means.

6. The decoder circuit recited in claim 5 including, multiplexer means connected to said decision flip-flop means and controlled by said decision signal.

7. The decoder recited in claim 1 wherein, said valuation means comprises a majority vote circuit for producing an output signal representative a majority of input signals.

8. The decoder recited in claim 7 wherein, said majority vote circuit comprises a plurality of adder circuits which operate on input signals supplied thereto.

9. The decoder recited in claim 8 wherein, said input signals represent the most significant bits of signals produced by said convergence means.

10. The decoder recited in claim 1 including, update multiplexer means connected to receive an input signal from said multiplexer means and an update input from said calculator means.

11. The decoder recited in claim 10 wherein, said shift register means comprises an extendedlength storage means having a length equal to the total of said plurality of shift registers and said multiplexer devices.

12. The decoder circuit recited in claim 1 including, control means for supplying control signals to each of said calculator means, said evaluator means, said convergence means and said valuation means.

13. The decoder circuit recited in claim 1 wherein, said calculator means further includes mode select means for converting a sign magnitude to a binary format and supplying signals to said serial-to-parallel converter means.

14. The decoder circuit recited in claim 1 wherein, said calculator means further includes shift register means which receives signals from said converter means and supplies signals to said full adder means.

* * * * *

UNITED STATES PATENT AND TRADEMARK OFFICE
CERTIFICATE OF CORRECTION

PATENT NO. : 4,536,878
DATED : August 20, 1985
INVENTOR(S) : Glen D. Rattlingourd, Robert J. Currie, Stanley D. Moss It is certified that error appears in the above-identified patent and that said Letters Patent are hereby corrected as shown below:

Column 5, lines 36-38, "tion. For nodes 0 and 1, H is equal to $H_{00}$ and E, ovs/H/ is equal to $H_{11}$ from the branch metric calculator. But, for nodes 4 and 5, H is equal to $H_{11}$, and $\overline{H}$ is equal to" should be -- tion. For nodes 0 and 1, H is equal to $H_{00}$ and $\overline{H}$ is equal to $H_{11}$ from the branch metric calculator. But, for nodes 4 and 5, H is equal to $H_{11}$ and $\overline{H}$ is equal to -- .

Signed and Sealed this

Fourteenth Day of January 1986

[SEAL]

Attest:

Attesting Officer

DONALD J. QUIGG

Commissioner of Patents and Trademarks